US006771472B1

(12) United States Patent
Mao et al.

(10) Patent No.: US 6,771,472 B1
(45) Date of Patent: Aug. 3, 2004

(54) STRUCTURE TO ACHIEVE THERMALLY STABLE HIGH SENSITIVITY AND LINEAR RANGE IN BRIDGE GMR SENSOR USING SAF MAGNETIC ALIGNMENTS

(75) Inventors: Sining Mao, Savage, MN (US); Songsheng Xue, Eden Prairie, MN (US); William Vavra, Maple Plain, MN (US); William Jude O'Kane, Co Derry (IE); James Keith Price, Tonka Bay, MN (US); Patrick Joseph Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 82 days.

(21) Appl. No.: 10/314,458

(22) Filed: Dec. 6, 2002

Related U.S. Application Data
(60) Provisional application No. 60/339,071, filed on Dec. 7, 2001.

(51) Int. Cl.[7] .............................. G11B 5/39; G01R 33/09
(52) U.S. Cl. .................................. 360/314; 324/207.21
(58) Field of Search ................................. 360/313, 314, 360/316, 324.1, 324.11, 324.12; 428/692; 73/862.333; 338/32 R; 324/202, 207.12, 207.21, 207.22, 207.23, 207.24, 207.25, 244, 252

(56) References Cited

U.S. PATENT DOCUMENTS

| | | | |
|---|---|---|---|
| 5,465,185 A | 11/1995 | Heim et al. | |
| 5,561,368 A | 10/1996 | Dovek et al. | |
| 5,929,636 A | 7/1999 | Torok et al. | |
| 6,069,476 A | 5/2000 | Vieux-Rochaz et al. | |
| 6,222,707 B1 | 4/2001 | Huai et al. | |
| 6,338,899 B1 | 1/2002 | Fukuzawa et al. | |

FOREIGN PATENT DOCUMENTS

DE 44 27 495 A1 2/1996

OTHER PUBLICATIONS

Y.R. Uhm et al., "Computer simulation of magnetization flop in magnetic tunnel junctions exchange–biased by synthetic antiferromagnets," *Journal of Magnetism and Magnetic Materials*, 237 (2001) pp. 206–214.

Terry J. Gafrom et al., "Current Density Limitations of Spin Valves," *IEEE Transactions on Magnetics*, vol. 36, No. 5, Sep. 2000, pp. 26112613.

B.C. Dodrill et al., Lake Shore Cryotronics, Inc., "Magnetic In–line Metrology for GMR Spin–Valve Sensors."

Robert M. White, "Magnetic Storage Industry Continues to Grow and Grow . . . ," *APS NEWS online*, Mar. 2001 Issue.

P. Ripka et al., "AC–driven AMR and GMR magnetoresistors," *Euorsensors XII*, 1998, Proc. pp. 967–969.

(List continued on next page.)

*Primary Examiner*—David Ometz (57) ABSTRACT

The invention provides a magnetic sensor having a first opposing pair and a second opposing pair of resistive elements configured in a Wheatstone bridge, wherein the resistive elements are a synthetic antiferromagnetic giant magnetoresistive sensor having a reference layer and a pinned layer of different thicknesses, wherein the first opposing pair has a net magnetic moment that is opposite to that of the second opposing pair, and wherein the first opposing pair has a thicker reference layer than pinned layer, and the second opposing pair has a thicker pinned layer than reference layer. Other embodiments of the invention have resistive elements that are opposingly bilayer and trilayer synthetic antiferromagnetic giant magnetoresistive sensors, or opposingly synthetic and standard antiferromagnetic giant magnetoresistive sensors.

40 Claims, 10 Drawing Sheets

OTHER PUBLICATIONS

J. Belleson et al., "IBM's Magnetoresistive and giant magnetoresistive head technologies enable data storage products with the industry's highest areal densities," *International Business Machines Corporation*, 1998.

"Giant Magneto Resistive Sensor," Data Sheet, Version 2.0 GMR B6, Infineon technologies, pp. 1–4.

"Utilization of GMR Materials," Copyright 1996, 1997, 1998, 2000 NVE Corporation (2 pages).

Caruso et al., "AMR magnetics field sensors were briefly introduced in the Dec. 1998 issue of Sensors ("A New Perspective on Magnetic Field Sensing"), Now we take a closer look at the way they work and where they are used." (10 pages).

FIG.10 Temperature tests carried from RT to 150C indicate a linear and reversible GMR and R changes for individual strip and out bridges of PtMn spin values.

FIG.11 Highly reversible temperature response from RT to 200C

STRUCTURE TO ACHIEVE THERMALLY STABLE HIGH SENSITIVITY AND LINEAR RANGE IN BRIDGE GMR SENSOR USING SAF MAGNETIC ALIGNMENTS

RELATED APPLICATION

This application claims priority to U.S. Provisional Application Serial No. 60/339,071 filed on Dec. 7, 2001, entitled "Structure to Achieve Thernally Stable High Scnsitivity And Linear Range In Bridge GMR Sensor Using SAF Magnetic Alignments".

FIELD OF THE INVENTION

The invention relates generally to magnetic sensors and more specifically to a thermally stable magnetic sensor in a bridge configuration having giant magnetoresistive sensors (GMR sensors) as resistive elements in a bridge design. Each adjacent resistor leg has an opposite response to an applied field providing a high and stable output signal.

BACKGROUND OF THE INVENTION

GMR structures are multilayer devices. GMR effect is based on a spin-dependent scattering of electrons and arises from the magnetic state of the overall layered device. GMR structures were first developed in 1991 and were called "spin valves". A basic spin valve typically consists of two ferromagnetic layers separated by a thin spacer or non-magnetic layer. Because of shape anisotropy, the magnetization of both of the ferromagnetic layers typically lies parallel in plane. Usually the magnetization in one ferromagnetic layer is fixed or pinned along a predetermined direction. The magnetization in the other or "free" or reference layer is allowed to rotate under the influence of an external magnetic field.

Such magnetic field sensors are widely used in applications such as linear and rotary motion sensors, proximity detectors, and speed and position sensors in automobiles. Common methods of detecting magnetic fields include Hall sensors and Anisotropic Magnetoresistance (AMR) filed sensors. Hall sensors are generally useful only for detection of relatively high magnetic fields (from 100 to 1000 Oe). AMR sensors generally have a small linear range, low saturation field, and poor sensitivity.

Currently available magnetic field sensors made from GMR devices have been used in a variety of applications. However, in these applications, the performance of the devices under varying temperatures has proved to be unstable, i.e., the magneto resistant characteristic of the sensors change substantially as the temperature changes. Often designs fail to provide a useful voltage output.

Therefore, there remains a need for a magnetic sensor that can operate with linear output over its operating range, substantial sensitivity in fields from 10 to 1000 Oe, has an acceptable signal amplitude and is stable, i.e., its magnetoresistance does not substantially change as the temperature varied from about room temperature (25° C.) to elevated temperatures (about 200° C.).

SUMMARY OF THE INVENTION

One embodiment of the invention provides a magnetic sensor that includes a first opposing pair and a second opposing pair of resistive elements configured in a Wheatstone bridge. In the Wheatstone bridge, the first opposing pair have magnetic polarities that are opposite to that of the second opposing pair, wherein each resistive element is a synthetic antiferromagnetic (SAF) GMR sensor having a reference layer and a pinned layer of different thicknesses. Each adjacent resistor leg has an opposite response to an applied magnetic field. This response is equal in amplitude to a single element. The opposing pinned/reference layer structure is attained by forming SAF structures of specific designs. The total thickness of the reference layer and the pinned layer is about 8 to 50 Å. The first opposing pair has a reference layer that is greater than about 1 Å or great than about 5 Å thicker than the pinned layer, and the second opposing pair has a pinned layer that is greater than about 1 Å or greater than about 5 Å thicker than the reference layer.

A second embodiment of the invention provides a magnetic sensor that includes a first and a second opposing pair of resistive elements configured in a Wheatstone bridge, wherein the first opposing pair have magnetic polarities that are opposite to that of the second opposing pair, wherein each of the resistive elements is a SAF GMR sensor, and wherein the first opposing pair has a bilayer structure, and the second opposing pair has a trilayer structure having similar thickness characteristics.

A third embodiment of the invention provides a magnetic sensor that includes a first and a second opposing pair of resistive elements configured in a Wheatstone bridge, wherein the first opposing pair have magnetic polarities that are opposite to that of the second opposing pair, wherein the first opposing pair include SAF GMR sensor that include a reference layer and a pinned layer of different thicknesses, and the second opposing pair includes standard antiferromagnetic GMR sensors having similar thickness characteristics.

A last embodiment is an SAF free layer with two magnetic layers sandwiched with an Ru layer. Depending on the thickness ratio between the two soft magnetic layers, the GMR responses will have different polarity even when the pinned direction is the same.

In these embodiments, the thickness of each layer in the structure can be sized to compensate for changes in the spin valve stack. The elements can be made in this way to improve magnetic stability and voltage output over the range of useful fields.

DETAILED DESCRIPTION OF THE INVENTION

In GMR structures, the magnetization in one ferromagnetic layer is fixed or pinned along a predetermined direction, while the magnetization of the free or reference layer is allowed to rotate under the influence of the applied magnetic field. In these layers, the scattering of electrons in the magnetic layer is spin dependent. Electrons with spins aligned parallel to the magnetization have long mean free paths, while the electrons with antiparallel spin alignments have short mean free paths resulting in a substantial difference in resistance of each type of aligned electron. When both layers have magnetization aligned with one another, half the electrons experience low scattering regardless of whether they are upper or lower magnetic layers. Electrons with their spin oriented antiparallel to the magnetic field suffer a large number of collisions and represent relatively high resistance paths. One of the primary figures for merit for a GMR device is called the GMR ratio which is a change in the resistance of the device normalized to the unaligned resistance given by the following expression:

$$GMR\ ratio = (R_a - R_u)^2/(R_a + R_u)^2$$

wherein $R_a$ is the aligned resistance and $R_u$ is unaligned resistance.

The temperature stability of these devices is dependent on the thickness of the pinned and reference layers. The total thickness of the combined pinned and reference layers ranges from about 8 to about 50 Å. In the Wheatstone bridge structure having a first and a second opposing pair of resistive elements, the first opposing pair of reference layer and pinned layer has a total thickness of about 18 to 80 Å and the first opposing pair has a reference layer that is at least 5 Å thicker than the pinned layer. Further, the second opposing pair has a pinned layer that is at least 5 Å thicker than the reference layer. These differences in thickness result in the thermal stability and controllable output of the reference device.

An important aspect of the design is the use of an applied magnetization vector adjacent to the AFM layer that induces the pinned field direction, during thermal annealing. In one design the two layer SAF (e.g.) CoFe/Ru/CoFe layers in each pair of legs in the Wheatstone bridge have the thickness ratio (pinned layer over reference layer) reversed to obtain an SAF structure in opposite directions during magnetization annealing that freezes the pinning field during cooling. The resulting field is <500 Oe.

DETAILED DESCRIPTION OF THE DRAWINGS AND A PREFERRED EMBODIMENT

Figure 1:
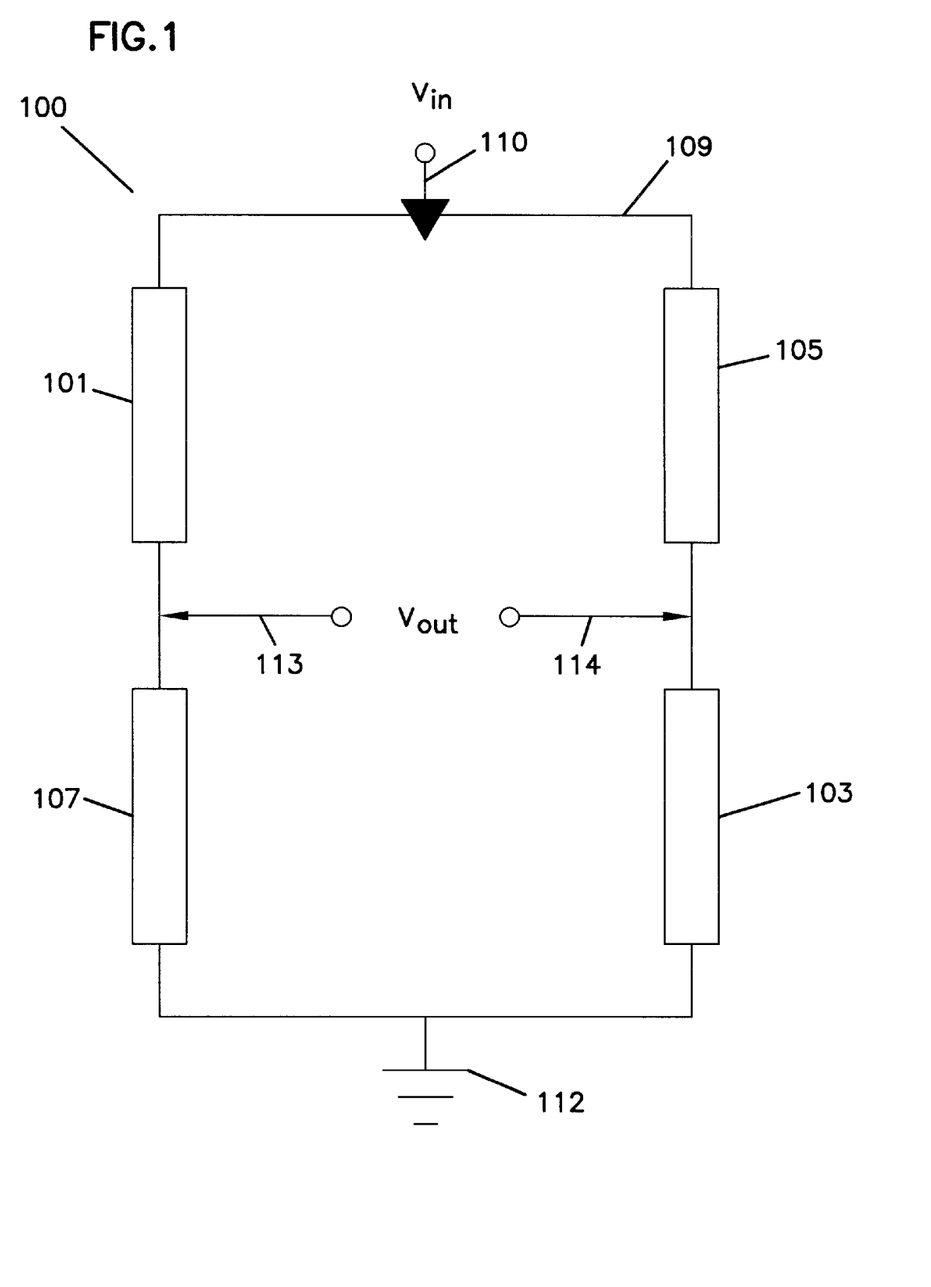
FIG. 1 depicts the general structure of a Wheatstone bridge.

FIG. 1 illustrates a configuration of a sensor 100 of the invention. The sensor 100 includes a first opposing pair and a second opposing pair of resistive elements. The first and second opposing pairs of resistive elements are made up of four resistive elements, a first resistive element 101, a second resistive element 103, a third resistive element 105, and a fourth resistive element 107. The first opposing pair can be the first resistive element 101 and the second resistive element 103, or the third resistive element 105 and the fourth resistive element 107. Similarly, the second opposing pair can be the first resistive element 101 and the second resistive element 103, or the third resistive element 105 and the fourth resistive element 107.

The first opposing pair and the second opposing pair are arranged in a Wheatstone bridge circuit, as illustrated in FIG. 1. Wheatstone bridge circuits of the invention will be generally described below with respect to embodiments of the invention embodied in a sensor 100. The sensor 100 has an input lead 110 located between the first resistive element 101 and the third resistive element 105. In this embodiment, the first opposing pair is the first resistive element 101 and the second resistive element 103 and the second opposing pair is the third resistive element 105 and the fourth resistive element 107.

The sensor 100 also has a ground 112 located between the second resistive element 103 and the fourth resistive element 107. The input lead 110 and the ground 112 function to provide a constant voltage, $V_{in}$, to the sensor 100. The sensor 100 has a first output lead 113 that is positioned between the first resistive element 101 and the fourth resistive element 107. The sensor 100 also has a second output lead 114 positioned between the second resistive element 105 and the third resistive element 103. The sensor 100 functions to read the difference between the two voltages from the first output lead 113 and the second output lead 114, $V_{out}$.

The resistive elements utilized in sensors of the invention include structures that exhibit giant magnetoresistive (GMR) effects. GMR structures exhibit a large change in resistance in response to an external magnetic field. GMR structures include films of two or more magnetic materials separated by a nonmagnetic material. Because of spin-dependent scattering of the electrons, the resistance is maximum when the magnetic moments of the films are antiparallel and minimum when they are parallel. GMR structures generally have at least one free portion whose magnetic polarity can change in the presence of external magnetic fields, and at least one pinned portion, whose magnetic polarity is fixed even in the presence of an external magnetic field. Generally, the magnetic polarity of the pinned portion is fixed through a thermal annealing step to be the same as the magnetic polarity of the antiferromagnetic layer. Throughout this specification, the magnetic polarity of an individual GMR structure, or resistive element, will be defined as the net magnetic moment of the individual GMR structure.

In a magnetic sensor of the invention, the magnetic polarity of the first opposing pair is opposite to that of the second opposing pair. For example the first resistive element 101 and the second resistive element 103 are the same, and opposite to that of the third resistive element 105 and the fourth resistive element 107. The functioning of the sensor 100 is based on this opposite magnetic polarity. When the sensor 100 is exposed to an external magnetic field, the magnetic polarity of the free portions of the resistive elements align themselves with the external magnetic field, if not already aligned. The pinned portion of the resistive elements do not change. Rotation in the free or reference portion causes a change in the overall resistance of each individual resistive element. The Wheatstone bridge circuit of the sensor 100 allows the magnitude and sign of the external magnetic field to be determined by measuring a difference in voltage between the two non-opposing pairs of resistive elements, which is dictated by the differences in resistivities thereof.

There are a number of embodiments of sensors of the invention. The different embodiments all share the same electrical configuration of the resistive elements within the Wheatstone bridge, but have different types or configurations of resistive elements.

Figure 2:
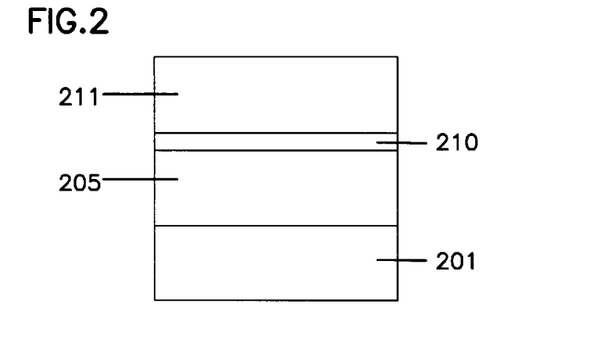
FIG. 2 depicts a GMR sensor utilized as a resistive element in a sensor in accordance with one embodiment of the invention.

All embodiments of the invention utilize GMR sensors as resistive elements. FIG. 2 represents a GMR sensor utilized as a resistive element in sensors of the invention include an antiferromagnetic portion 201, a pinned portion 205, a spacer portion 210, and a free or reference portion 211. It should also be understood that GMR sensors used in the invention can have other layers above and/or below those depicted herein. Examples of such layers include but are not limited to capping layers and seed layers. The invention also envisions and encompasses the use of top spin valves as the resistive elements. All of the resistive elements depicted herein are bottom spin valves. However, one of ordinary skill in the art, having read this specification, would know how to convert the various configurations of resistive elements into top spin valve resistive elements.

The antiferromagnetic portion 201 functions to set the magnetic polarity of the pinned portion 205. The antiferromagnetic portion 201 can be either nickel manganese (NiMn) or platinum manganese (PtMn). These materials are utilized because of their high blocking temperatures. An antiferromagnetic material with a high blocking temperature is one whose magnetic polarity will not change even at high temperatures.

The pinned portion 205 functions to maintain a constant magnetic polarity thereof even when exposed to an external magnetic field. A difference in the magnetic polarity of the pinned portion 205 and the free or reference portion 211 causes the resistance of the GMR sensor to change in the presence of an external magnetic field. The pinned portion 205 may either be a standard antiferromagnetic structure or a SAF structure. Details of both types of these structures will be discussed in greater detail in embodiments containing them.

The spacer portion 210 generally functions to separate the pinned portion 205 from the free portion 211. The spacer portion 210 is generally made of copper (Cu), CuAg and CuAu. In some embodiments of the invention, the copper of the spacer layer 210 is replaced with an insulating material. In this case, the GMR properties of the GMR sensor are due to spin tunneling effect.

The free or reference portion 211, as discussed above, functions to detect external magnetic fields by aligning its magnetic polarity with that of the external magnetic field. Generally, the free portion 211 is made of an antiferromagnetic material, including but not limited to CoFe, NiFe, NiFeCo or NiFeX, wherein X is Cr, Ti, Ta, Nb, Ru or Rh. In some embodiments of the invention, the free portion 211 is made of a SAF material.

Figure 3:
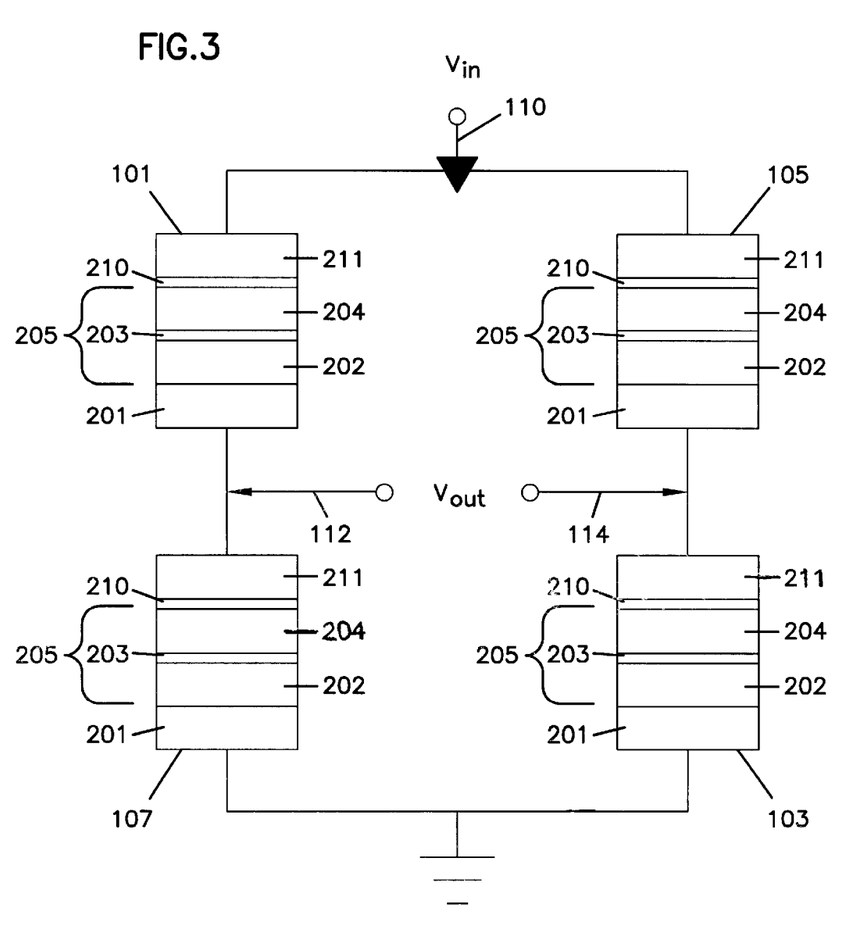
FIG. 3 depicts a sensor in accordance with a first embodiment of the invention that utilizes a giant magnetoresistive element as illustrated in FIG. 2.

A first embodiment of the invention is depicted in FIG. 3. In this embodiment, the pinned portion 205 is a SAF material. The pinned portion 205 includes a pinned layer 202, a spacer layer 203, and a reference layer 204. The magnetic polarity of the first and second opposing pairs of resistive elements are made opposite by changing the relative thicknesses of the pinned layer 202 and the reference layer 204 in the opposing resistive elements. If the thicknesses of the pinned layer 202 and the reference layer 204 of an individual pinned portion 205 are the same, the pinned portion 205 will have a net magnetic moment of zero or no magnetic polarity. However, if an individual pinned portion 205 has either the pinned layer 202 or the reference layer 204 thicker than the other layer, the pinned portion 205 will have an overall net magnetic moment or magnetic polarity. The magnetic polarity of the pinned portion 205 will be parallel to the magnetic moment of the thicker of the pinned layer 202 and the reference layer 204.

Therefore, in this embodiment, the first resistive element 101 and the second resistive element 103 have a magnetic polarity that is opposite to the third resistive element 105 and the fourth resistive element 107, the first resistive element 101 and the second resistive element 103 both have one layer (either the pinned layer 202 or the reference layer 204) that is thicker, and the third resistive element 105 and the fourth resistive element 107 both have the opposite layer that is thicker.

In an alternative embodiment the first resistive element 101 and the second resistive element 103 have the pinned layer 202 thicker than the reference layer 204 so that the magnetic polarity of the resistive elements is dictated by the pinned layer 202. Conversely, the third resistive element 105 and the fourth resistive element 107 have a magnetic polarity dictated by the reference layer 204, because the reference layer 204 is thicker than the pinned layer 202.

When undertaking the thermal annealing that sets the magnetic moment of the various layers, the field utilized to set the magnetic moments of the layer should be less than the critical field, which depends on the magnetic properties of the SAF structure. Typically, therefore, the field should be less than about 500 Oe.

In a second embodiment of the invention the first opposing pair of resistive elements has a bilayer SAF structure and the second opposing pair of resistive elements has a trilayer SAF structure. One configuration of a sensor in accordance with this embodiment of the invention is depicted in FIG. 4.

Figure 4:
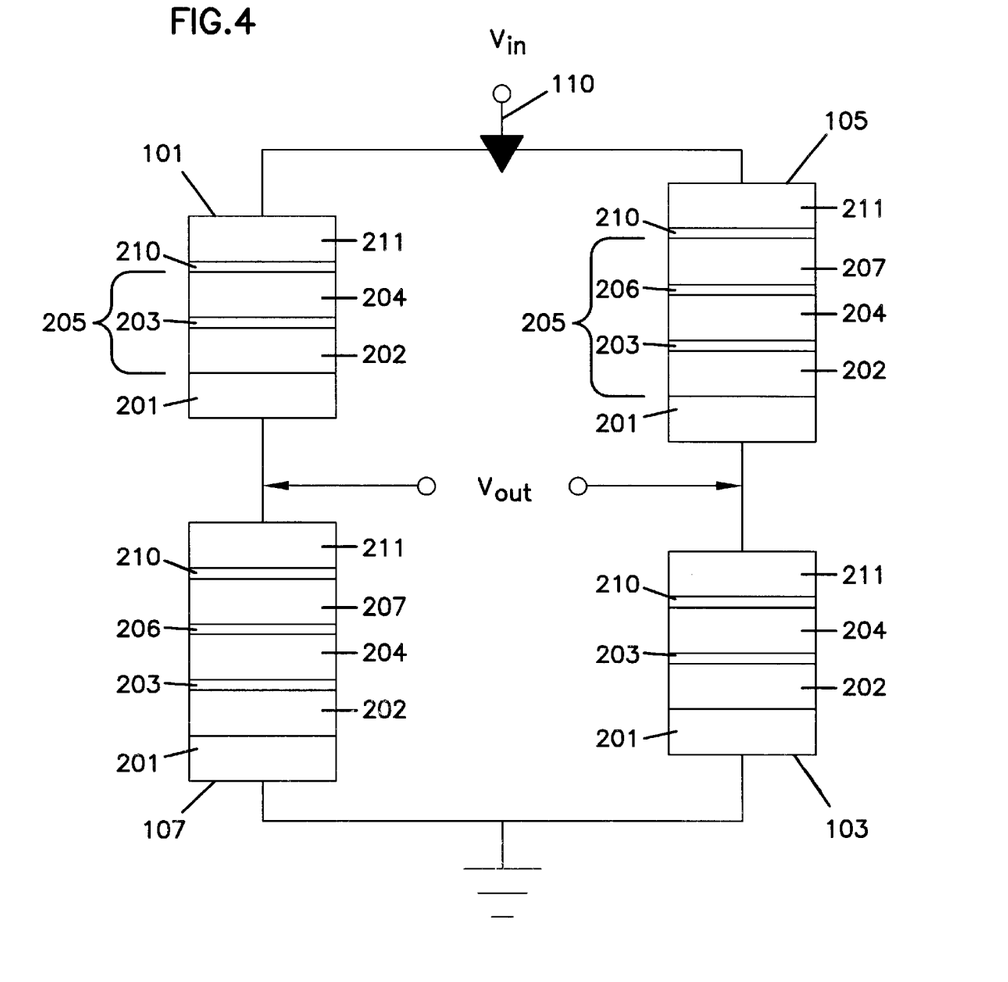
FIG. 4 depicts a sensor in accordance with a second embodiment of the invention.

In the embodiment depicted in FIG. 4, the first resistive element 101 and the second resistive element 103 have the same structure as the resistive elements used in the first embodiment of the invention. Specifically, the first resistive element 101 and the second resistive element 103 have a pinned portion 205 that includes a pinned layer 202, a spacer layer 203, and a reference layer 204. In this embodiment, the reference layer 204 in both the first resistive element 101 and the second resistive element 103 are thicker than the pinned layer 202. Therefore, the first resistive element 101 and the second resistive element 103 have their magnetic polarity dictated by the reference layer 204. Alternatively, the magnetic polarity could be dictated by the pinned layer 202 by having it thicker.

The third resistive element 105 and the fourth resistive element 107 in this embodiment have additional layers not present in the first resistive element 101 and the second resistive element 103. The third resistive element 105 and the fourth resistive element 107 have the pinned portion 205 that are the same as that of the first resistive element 101 and the second resistive element 103. Then, on top of the reference layer 204 of the pinned portion 205, there is a second spacer layer 206, and a second reference layer 207. Addition of the second spacer layer 206 and the second reference layer 207 creates what is referred to herein as a trilayer structure, as opposed to the bilayer structure of the first resistive element 101 and the third resistive element 103.

The pinned portion 205 in the third resistive element 105 and the fourth resistive element 107 are exactly the same as the corresponding layers in the first resistive element 101 and the second resistive element 103. Therefore, without addition of the second spacer layer 206 and the second reference layer 207, all four resistive elements would have the same magnetic polarity. However, addition of the second spacer layer 206 and the second reference layer 207, which will magnetically orient themselves opposite to that of the reference layer 204, will make the magnetic polarity of the third resistive element 105 and the fourth resistive element 107 opposite to that of the first resistive element 101 and the second resistive element 103.

A sensor in accordance with this embodiment could also be configured with the first resistive element 101 and the second resistive element 103 being a trilayer structure and the third resistive element 105 and the fourth resistive element 107 being a bilayer structure.

When thermally annealing resistive elements utilized in this embodiment of the invention, the annealing field used to set the magnetic moment of the layers must be very high in order to align all of the magnetic layers in the trilayer structure. Typically, a field above about 1 Tesla should be utilized.

Figure 5:
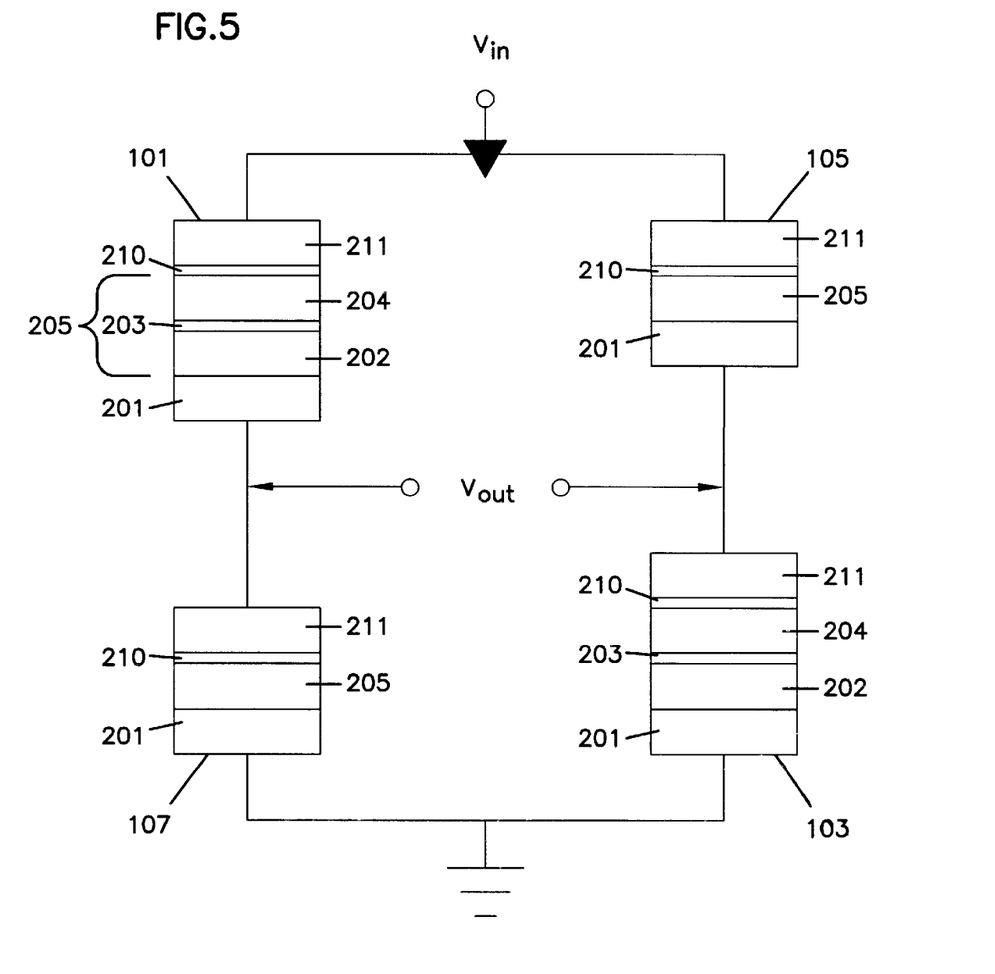
FIG. 5 depicts a sensor in accordance with a third embodiment of the invention.

FIG. 5 depicts a third embodiment of the invention. This embodiment of the invention utilizes a SAF bilayer structure for the first resistive element 101 and the second resistive element 103, and a standard antiferromagnetic structure for the third resistive element 105 and the fourth resistive element 107.

In this embodiment, the SAF structure of the first resistive element 101 and the second resistive element 103 are the same as that of the resistive elements used in the first embodiment of the invention. Specifically, the first resistive element 101 and the second resistive element 103 have a pinned portion 205 that includes a pinned layer 202, a spacer layer 203, and a reference layer 204. In this embodiment, the reference layer 204 in both the first resistive element 101 and the second resistive element 103 are thicker than the pinned layer 202. Therefore, the first resistive element 101 and the second resistive element 103 have their magnetic polarity dictated by the reference layer 204. Alternatively, the magnetic polarity could be dictated by the pinned layer 202 by having it thicker.

The third resistive element 105 and the fourth resistive element 107 have a standard antiferromagnetic structure. Specifically, the third resistive element 105 and the fourth resistive element 107 have a pinned portion 205 that includes only one layer. In this structure, the one layer pinned portion 205 accomplishes the same thing as the pinned portion 205 that includes the pinned layer 202, the spacer layer 203, and the reference layer 204. In this embodiment, the pinned portion 205 includes a monolayer of a material such as a CoFe, NiFe, and NiCoFe.

A sensor of this embodiment could also be configured with the first resistive element 101 and the second resistive element 103 being a standard antiferromagnetic structures and the third resistive element 105 and the fourth resistive element 107 being SAF structures.

Figure 6:
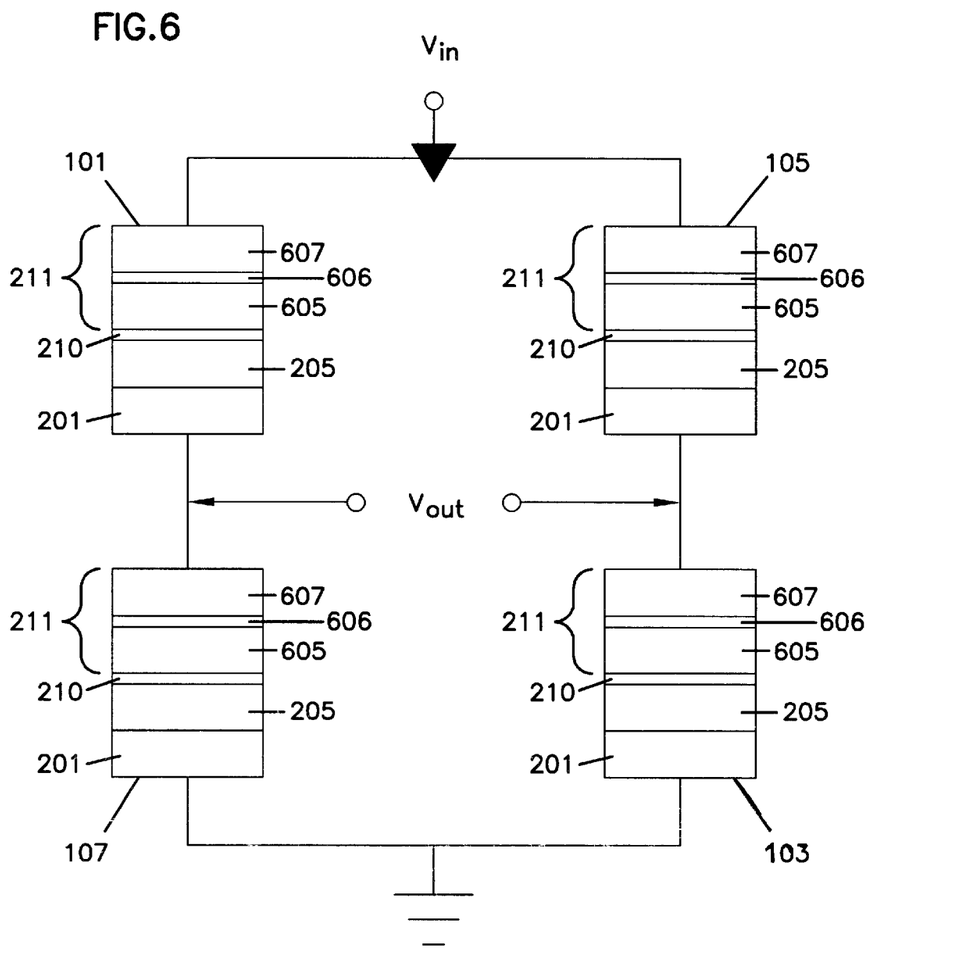
FIG. 6 depicts a sensor in accordance with a fourth embodiment of the invention.

A fourth embodiment of the invention is depicted in FIG. 6. In this embodiment, the pinned portion 205 of the resistive elements have a standard antiferromagnetic structure, but the free portions 211 have a SAF structure. For example, the first resistive element 101 and the second resistive element 103 have an antiferromagnetic portion 201, a monolayer pinned portion 205, a spacer layer 210, and a free portion 211 that includes a free reference layer 605, a free spacer layer 606, and a free pinned layer 607.

The magnetic polarity of the two opposing pairs in this embodiment are made opposite by changing the relative thicknesses of the free pinned layer 605 and the free reference layer 607. If the thicknesses of the free pinned layer 605 and the free reference layer 605 are identical, the free portion 211 will have a net magnetic moment of zero. However, if either the free pinned layer 605 or the free reference layer 607 is made thicker than the other, the free portion 211 will have an overall net magnetic moment. In this way the free portion 211 of the first opposing pair of resistive elements have an opposite magnetic polarity to that of the free portion 211 of the second opposing pair of resistive elements.

The invention utilizes the phenomenon of spin tunneling types of GMR sensors. Generally, a spin tunneling structure has an insulating layer separating two magnetic layers. The conduction of the structure is due to quantum tunneling through the insulator. The magnitude of the tunneling current is determined in part by the magnetization vectors in the two magnetic layers.

Any of the previous embodiments can be modified in accordance with this embodiment. To make a sensor in accordance with this embodiment of the invention, the spacer portion 210, which in the above embodiments was made of copper, is replaced by an insulating material. Examples of insulating materials that can be utilized include but is not limited to $Al_2O_3$, HfO, ZrO, TaO, NbO, TiO, MnO, MoO, WO, VO, or the oxides of their alloys.

Experimental

Layered sensors were fabricated for the purpose of demonstrating that the polarity of the bridge elements could be controlled using the fabrication structure and to demonstrate the temperature stability of the structures.

The general fabrication techniques used to form the GMR elements involved physical vapor deposition using conventional sputtering techniques. Sputtering was conducted at low pressure typically about $10^{-8}$ torr. A sequence of metallic layers were sputtered using conventional technology as set forth in the following table. Layer thickness typically controlled by energy input to the sputter structure, internal chamber pressure and length of deposition time. Conventional thickness measuring techniques can be used to monitor deposition rates during fabrication. The direction of magnetization is obtained by applying a magnetic field bias (about 20 to 100 Oe) to the layers as they are being deposited. Silicon wafers were selected as a substrate material because they are available at reasonable cost. The wafers were initially cleaned using conventional techniques and an insulating oxide layer was laid down followed by the metal sputtering. The following table sets forth the structure of sensor devices made by laying down synthetic antiferromagnetic layers and other layers as shown.

TABLE 1

| SAF Structure and Other Layers in Sensor Device | | |
|---|---|---|
| Metals | Example 1 (Å) | Example 2 (Å) |
| Ta | 50 | 50 |
| CoFe | 30 | 30 |
| Cu | 30 | 30 |
| CoFe | 25 | 25 |
| Ru | 8 | 8 |
| CoFe | 20 | 20 |
| Ru (diffusion buffer) | — | 8 |
| CoFe | — | 25 |
| PtMn | 200 | 200 |
| CoFe | 10 | 10 |
| NiFeCr | 50 | 50 |
| Si | Substrate Layer | Substrate Layer |

Figure 7:
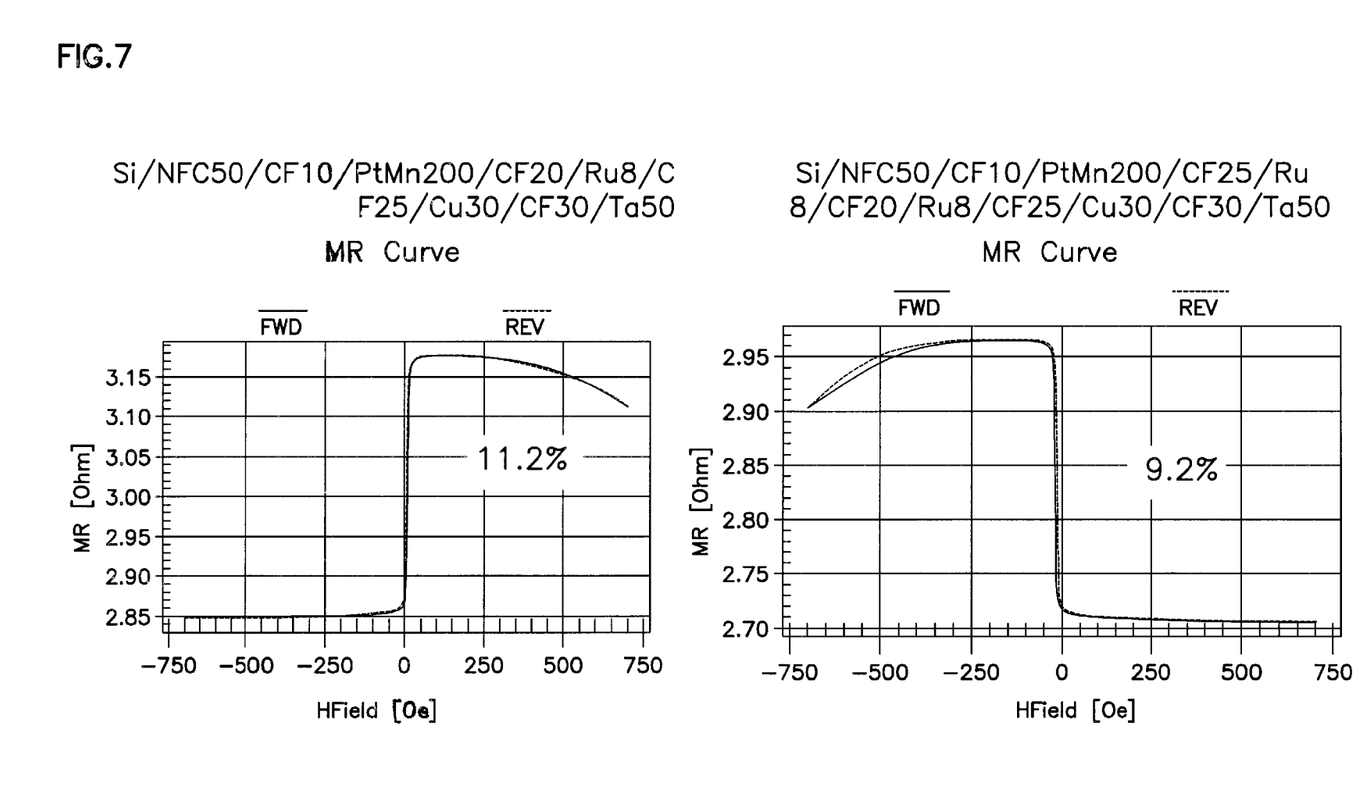
FIGS. 7–11 show the polarity characteristics, and thermal stability of the GMR bridge devices fabricated according to the invention.

The sensor devices shown in Examples 1 and 2 were tested for resistance polarity in a varying magnetic field as shown in the FIG. 7. The response shown in FIG. 7 demonstrates the excellent magnetic characteristics of this structure. The ability to change polarity by adding or removing layers provides flexibility in fabrications. The response to the changing magnetic field for Examples 1 and 2 is similar, but reversed in polarity.

TABLE 2

SAF Structure and Other Simple Pinned Layers in Sensor Device

| Metals | Example 3 (Å) | Example 4 (Å) |
|---|---|---|
| Ta | 50 | 50 |
| CoFe | 30 | 20 |
| Ru | — | 8 |
| CoFe | — | 30 |
| Cu | 8 | 30 |
| CoFe | 25 | 25 |
| PtMn | 200 | 200 |
| CoFe | 10 | 10 |
| NiFeCr | 50 | 50 |
| Si | Substrate Layer | Substrate Layer |

Figure 8:
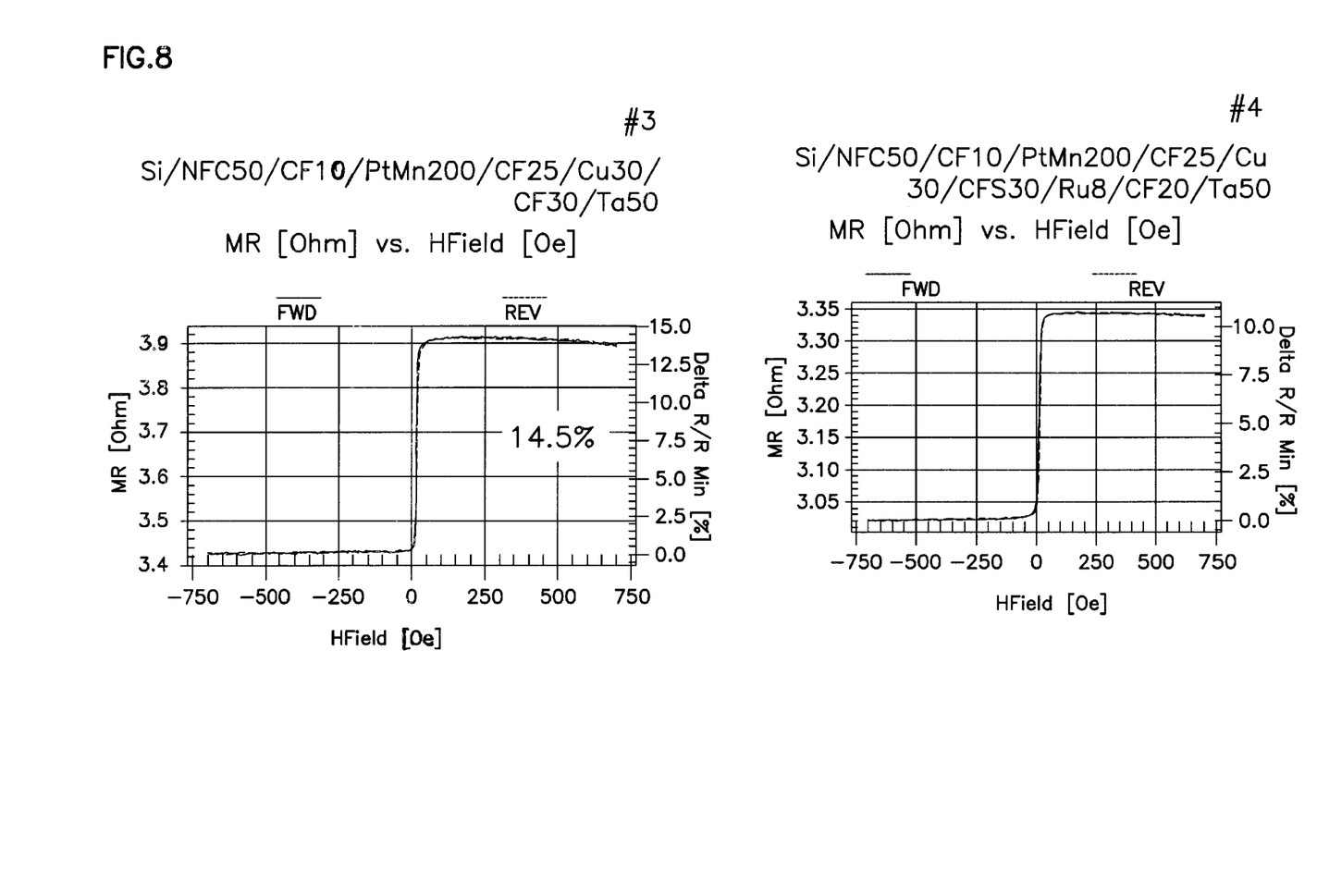

The magnetic properties of the structures of Examples 3 and 4 of Table 2 are shown in FIG. 8. The response shown in FIG. 8 demonstrates that the effect can be obtained with reduced layer fabrication and that the reduced layer device can save a polarity reversal with added layer.

TABLE 3

SAF Structure and Other Simple Pinned Layers in Sensor Device

| Metals | Example 5 (Å) |
|---|---|
| Ta | 50 |
| CoFe | 30 |
| Ru | 8 |
| CoFe | 20 |
| Cu | 30 |
| CoFe | 25 |
| PtMn | 200 |
| CoFe | 10 |
| NiFeCr | 50 |
| Si | Substrate Layer |

Figure 9:
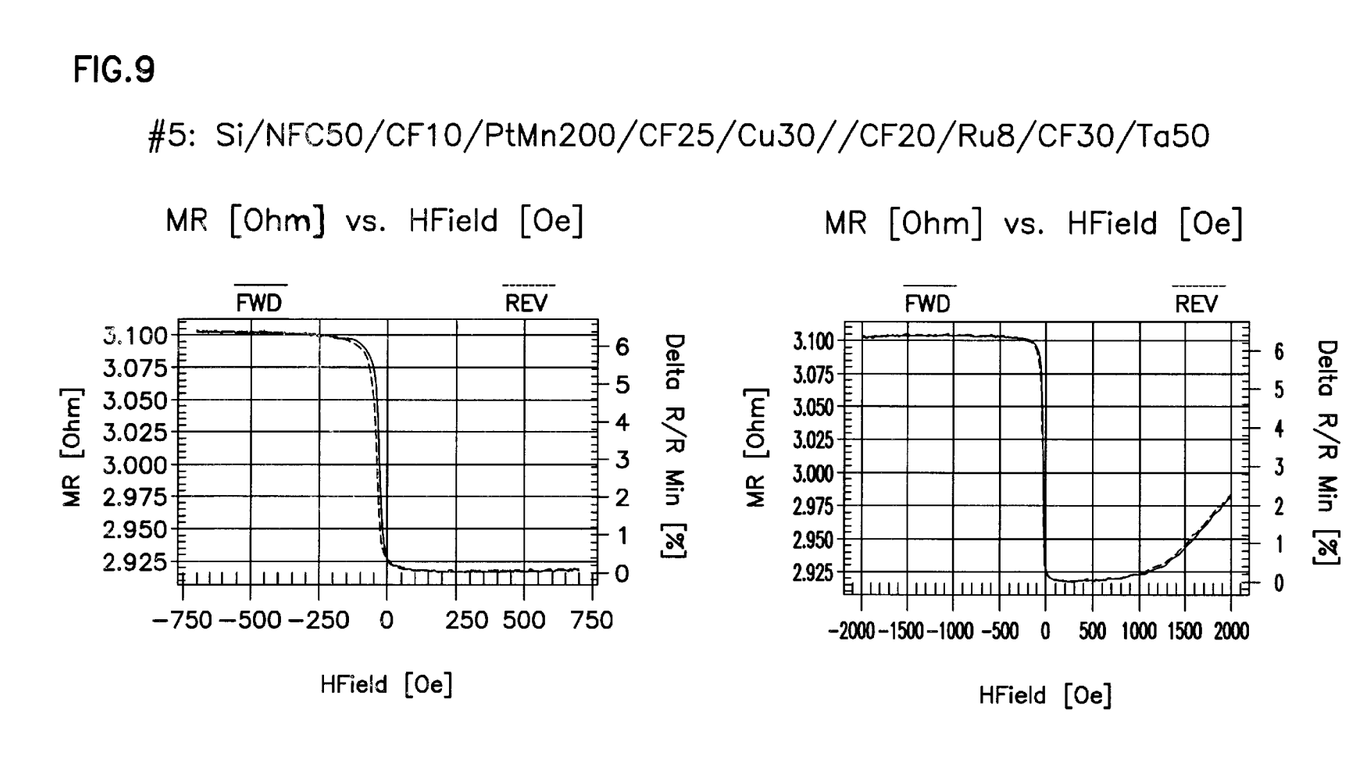

The magnetic properties of the structure of Example 5 of Table 3 is shown in FIG. 9. This structure with small modifications in the device (compare to Example 4 and FIG. 8) can reverse polarity.

Platinum manganese spin valves were fabricated similar to those shown in Examples 1 and 2. The samples were made on a PVD sputtering system with metallic targets. Layers of various metals were sputtered sequentially onto a substrate (glass or Si). The thicknesses were optimized for best GMR response. The samples were annealed at a temperature of about 250° C. to 300° C. in a magnetic field to induce the pinning field in the PtMn.

Figure 10:
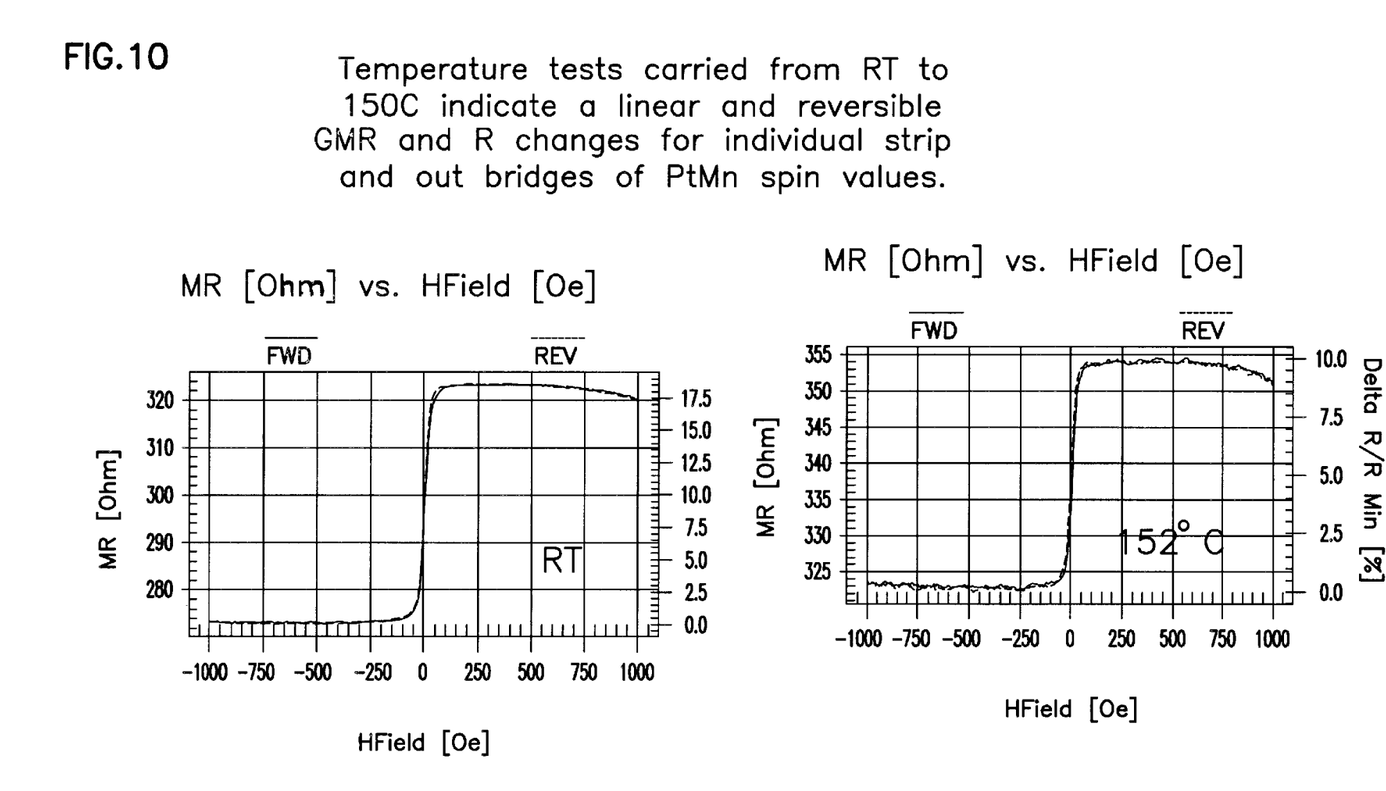

These spin valves were tested for temperature stability at room temperature and 152° C. These temperature tests (shown in FIG. 10) indicate a linear reversible giant magnetoresistance and resistive changes for individual strip materials and bridges made from the platinum manganese spin valves.

Figure 11:
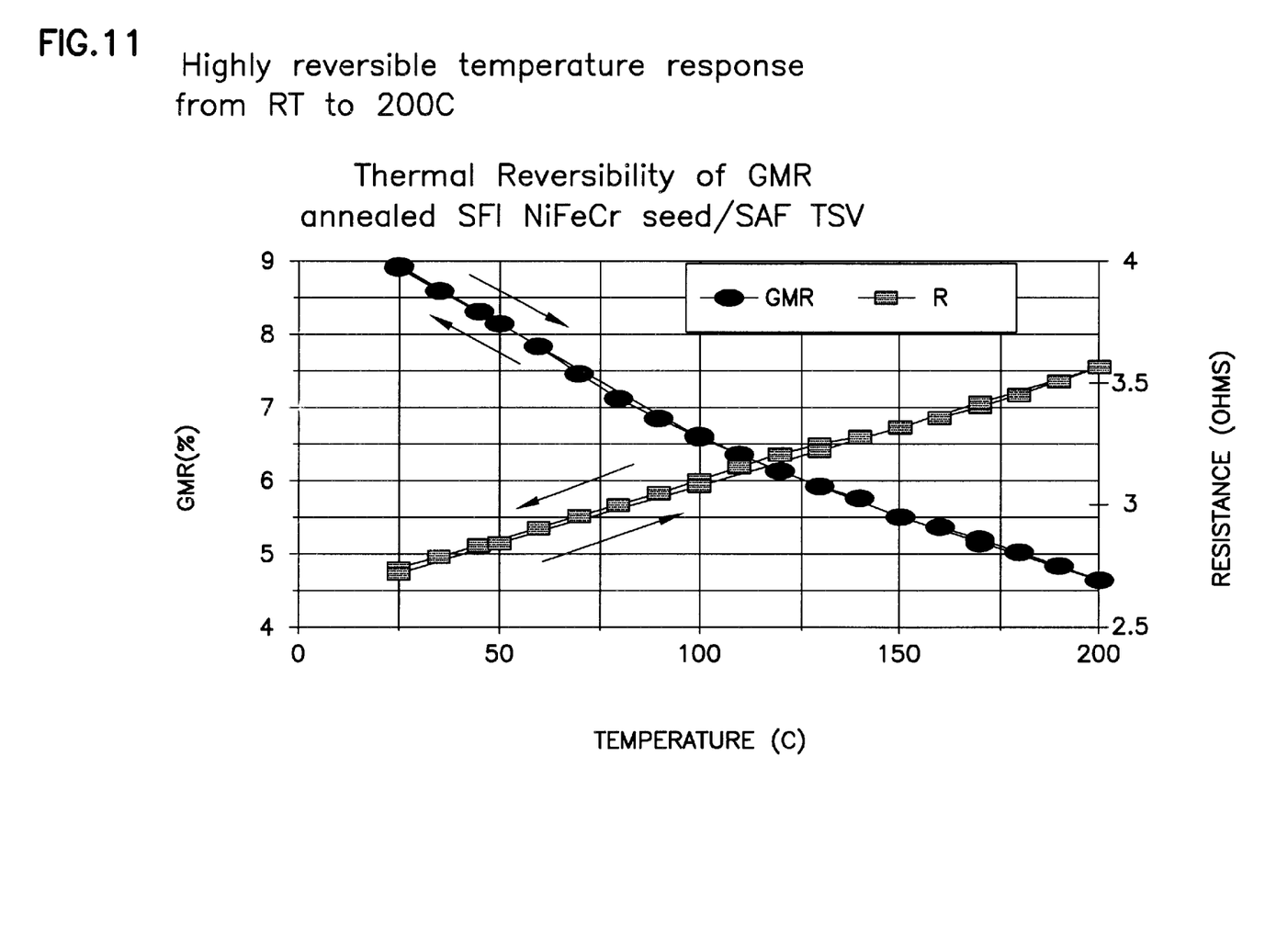

Sensors similar to those shown in Example 1 were tested to determine the effect on GMR ratio and resistance as temperatures varied from about 25° C. to about 200° C. As shown in FIG. 11, both the GMR ratio (expressed as a percent) and the resistance in ohms is highly temperature reversible and constant from room temperature through 200° C. showing little variation in either value as temperature is either increased or decreased cyclically. The samples used in the test are top type spin valves with the following structure:

Substrate/Ta50 Å/NiFeCr50 Å/NiFe35 Å/CoFe15 Å/Cu28 Å/CoFe25 Å/Ru25 Å/CoFe30 Å/PtMn200 Å/Ta50 Å cap.

The data shown graphically in FIGS. 7 through 11 show that the sensors are flexible in terms of polarity when they are used in the bridge elements, are sensitive and can be used in fields from greater than 0 to 1000 Oe, are linear in output and such linearity is stable over broad range of temperatures.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A magnetic sensor comprising a first opposing pair and a second opposing pair of resistive elements configured in a Wheatstone bridge, wherein each of said resistive elements comprises a synthetic antiferromagnetic giant magnetoresistive structure comprising a reference layer and a pinned layer, wherein said first opposing pair has a net magnetic moment that is opposite to that of said second opposing pair, and wherein said first opposing pair has a reference layer thicker than the pinned layer, and said second opposing pair has a pinned layer thicker than said reference layer.

2. The magnetic sensor of claim 1, wherein said reference layer and said pinned layer has a total thickness of about 18 to 80 Å.

3. The magnetic sensor of claim 1, wherein said said first opposing pair has a reference layer at least 1 Å thicker than the pinned layer.

4. The magnetic sensor of claim 1, wherein said said second opposing pair has a reference layer at least 1 Å thicker than the pinned layer.

5. The magnetic sensor of claim 1, wherein said reference and said pinned layers are CoFe.

6. The magnetic sensor of claim 1 further comprising an antiferromagnetic layer.

7. The magnetic sensor of claim 3, wherein said antiferromagnetic layer is chosen from the group consisting of NiMn, and PtMn.

8. The magnetic sensor of claim 1, wherein said reference layer and said pinned layer form a part of a pinned portion.

9. The magnetic sensor of claim 1, wherein said reference layer and said pinned layer form a part of a free portion.

10. The magnetic sensor of claim 1, further comprising a spacer portion.

11. The magnetic sensor of claim 9, wherein said spacer portion is chosen from the group consisting of: Cu, $Al_2O_3$, HfO, ZrO, TaO, NbO, TiO, MnO, MoO, WO, VO, and the oxides of their alloys.

12. The magnetic sensor of claim 1 wherein said first opposing pair comprises a bilayer structure, and said second opposing pair comprises a trilayer structure.

13. The magnetic sensor of claim 1 wherein the first opposing pair have magnetic polarities that are opposite to that of the second opposing pair, the first opposing pair include SAF GMR sensor that include a reference layer and a pinned layer of different thicknesses, and the second opposing pair includes standard antiferromagnetic GMR sensors having similar thickness characteristics.

14. The magnetic sensor of claim 1 wherein the sensor comprises an SAF free layer comprising two magnetic layers with an Ru layer placed therebetween.

15. A magnetic sensor comprising a first opposing pair and a second opposing pair of resistive elements configured in a Wheatstone bridge, wherein each of said resistive elements comprises a synthetic antiferromagnetic giant magnetoresistive structure comprising a reference layer and a pinned layer, wherein said first opposing pair has a net magnetic moment that is opposite to that of said second opposing pair, and wherein said first opposing pair has a reference layer at least 1 Å thicker than the pinned layer, and said second opposing pair has a pinned layer at least 1 Å thicker than said reference layer.

16. The magnetic sensor of claim 15, wherein said reference and said pinned layer have a total thickness of about 18 to 80 Å.

17. The magnetic sensor of claim 15, wherein said said first opposing pair has a reference layer at least 5 Å thicker than the pinned layer.

18. The magnetic sensor of claim 15, wherein said said second opposing pair has a reference layer at least 5 Å thicker than the pinned layer.

19. The magnetic sensor of claim 15, wherein said reference and said pinned layers are CoFe.

20. The magnetic sensor of claim 15 further comprising an antiferromagnetic layer.

21. The magnetic sensor of claim 20, wherein said antiferromagnetic layer is chosen from the group consisting of NiMn, and PtMn.

22. The magnetic sensor of claim 15, wherein said reference layer and said pinned layer form a part of a pinned portion.

23. The magnetic sensor of claim 15, wherein said reference layer and said pinned layer form a part of a free portion.

24. The magnetic sensor of claim 15, further comprising a spacer portion.

25. The magnetic sensor of claim 24, wherein said spacer portion is chosen from the group consisting of: Cu, $Al_2O_3$, HfO, ZrO, TaO, NbO, TiO, MnO, MoO, WO, VO, and the oxides of their alloys.

26. The magnetic sensor of claim 15 wherein said first opposing pair comprises a bilayer structure, and said second opposing pair comprises a trilayer structure.

27. The magnetic sensor of claim 15 wherein the first opposing pair have magnetic polarities that are opposite to that of the second opposing pair, the first opposing pair include SAF GMR sensor that include a reference layer and a pinned layer of different thicknesses, and the second opposing pair includes standard antiferromagnetic GMR sensors having similar thickness characteristics.

28. The magnetic sensor of claim 15 wherein the sensor comprises an SAF free layer comprising two magnetic layers with an Ru layer placed therebetween.

29. A magnetic sensor comprising a first opposing pair and a second opposing pair of resistive elements configured in a Wheatstone bridge, wherein each of said resistive elements comprises a synthetic antiferromagnetic giant magnetoresistive structure comprising an anti ferromagnetic portion, a reference layer and a pinned layer combined with a spacer layer between the reference and pinned layer, wherein said first opposing pair has a net magnetic moment that is opposite to that of said second opposing pair, and wherein said first opposing pair has a reference layer at least 1 Å thicker than the pinned layer, and said second opposing pair has a pinned layer at least 1 Å thicker than said reference layer.

30. The magnetic sensor of claim 29, wherein said reference and said pinned layers have a total thickness of about 18 to 80 Å.

31. The magnetic sensor of claim 29, wherein said reference and said pinned layers are CoFe.

32. The magnetic sensor of claim 29 further comprising an antiferromagnetic layer comprising CoFe, NiFe, NiFeCo or NiFeX, wherein X is Cr, Ti, Ta, Nb, Ru or Rh.

33. The magnetic sensor of claim 32, wherein said antiferromagnetic layer is chosen from the group consisting of NiMn, and PtMn.

34. The magnetic sensor of claim 29, wherein said reference layer and said pinned layer form a part of a pinned portion.

35. The magnetic sensor of claim 29, wherein said reference layer and said pinned layer form a part of a free portion.

36. The magnetic sensor of claim 29, further comprising a spacer portion.

37. The magnetic sensor of claim 36, wherein said spacer portion is chosen from the group consisting of: Cu, $Al_2O_3$, HfO, ZrO, TaO, NbO, TiO, MnO, MoO, WO, VO, and the oxides of their alloys.

38. The magnetic sensor of claim 29 wherein said spacer layer comprises Cu, CuAg or CuAu.

39. The magnetic sensor of claim 29 wherein the first opposing pair have magnetic polarities that are opposite to that of the second opposing pair, the first opposing pair include SAF GMR sensor that include a reference layer and a pinned layer of different thicknesses, and the second opposing pair includes standard anti ferromagnetic GMR sensors having similar thickness characteristics.

40. The magnetic sensor of claim 29 wherein the sensor comprises a free layer comprising two magnetic layers with an Ru layer placed therebetween.

* * * * *

UNITED STATES PATENT AND TRADEMARK OFFICE
CERTIFICATE OF CORRECTION

PATENT NO. : 6,771,472 B1
DATED : August 3, 2004
INVENTOR(S) : Sining Mao et al.

It is certified that error appears in the above-identified patent and that said Letters Patent is hereby corrected as shown below:

Column 10,
Line 34, replace "3" with -- 6 --.
Line 43, replace "9" with -- 10 --.

Signed and Sealed this

First Day of November, 2005

JON W. DUDAS
*Director of the United States Patent and Trademark Office*